United States Patent [19]
Jeckeln et al.

[11] Patent Number: 6,072,364
[45] Date of Patent: Jun. 6, 2000

[54] ADAPTIVE DIGITAL PREDISTORTION FOR POWER AMPLIFIERS WITH REAL TIME MODELING OF MEMORYLESS COMPLEX GAINS

[75] Inventors: Ernesto G. Jeckeln; Fadhel M. Ghannouchi, both of Montreal; Mohamad A. Sawan, Laval, all of Canada

[73] Assignee: Amplix, Montreal, Canada

[21] Appl. No.: 08/877,479

[22] Filed: Jun. 17, 1997

[51] Int. Cl.$^7$ ........................................ H03F 1/26
[52] U.S. Cl. ........................................ 330/149; 332/103
[58] Field of Search ........................... 330/149; 332/103, 332/107, 123, 159, 160; 375/297; 455/63, 126

[56] References Cited

U.S. PATENT DOCUMENTS

| | | | |
|---|---|---|---|
| 4,291,277 | 9/1981 | Davis et al. | 330/149 |
| 4,700,151 | 10/1987 | Nagata | 332/18 |
| 4,985,688 | 1/1991 | Nagata | 332/123 |
| 5,049,832 | 9/1991 | Cavers | 330/149 |
| 5,113,414 | 5/1992 | Karam et al. | 375/60 |
| 5,119,040 | 6/1992 | Long et al. | 330/149 |
| 5,148,448 | 9/1992 | Karam et al. | 375/60 |
| 5,237,288 | 8/1993 | Cleveland | 330/107 |
| 5,262,734 | 11/1993 | Dent et al. | 330/52 |
| 5,396,190 | 3/1995 | Murata | 330/149 |
| 5,404,378 | 4/1995 | Kimura | 375/296 |
| 5,420,536 | 5/1995 | Faulkner et al. | 330/149 |
| 5,491,457 | 2/1996 | Feher | 332/103 |
| 5,524,285 | 6/1996 | Wray et al. | 455/126 |
| 5,524,286 | 6/1996 | Chiesa et al. | 455/126 |
| 5,568,088 | 10/1996 | Dent et al. | 330/151 |
| 5,598,436 | 1/1997 | Brajal et al. | 375/297 |
| 5,650,758 | 7/1997 | Xu et al. | 330/149 |
| 5,699,383 | 12/1997 | Ichiyoshi | 375/297 |

OTHER PUBLICATIONS

E.G. Jeckeln, F.M. Ghannouchi and M. Sawan, "Adaptive Digital Predistorter for Power Amplifiers with Real Time Modeling of Memoryless Complex Gain", IEEE MTT–S International Microwave Symposium, San Francisco, Jun. 1996.

E.G. Jeckeln, F.M. Ghannouchi and M. Sawan, "Adaptive Digital Predistorter for Power Amplifiers with Real Time Modeling of Memoryless Complex Gain", IEEE Transaction on Microwave Theory and Thechniques (submitted, Mar. 29, 1996).

J.G. Proakis, "Digital Communications", McGraw Hill, 1983.

J.H. Mathews, "Numerical Methods", for Computer Science, Engineering, and Mathematics, McGraw Hill, 1989.

"Adaptive Linearization of Power Amplifiers in Digital Radio Systems" Saleh et al., The Bell System Technical Journal, vol. 62, No. 4, Apr. 1983 pp. 1019–1033.

(List continued on next page.)

*Primary Examiner*—Robert Pascal
*Assistant Examiner*—Khanh Van Nguyen
*Attorney, Agent, or Firm*—Griffin, Butler, Whisenhunt & Szipl, LLP

[57] ABSTRACT

In an adaptive method and device for predistorting a signal to be transmitted, supplied by a signal source to an input of a power amplifier having a output for delivering an amplified output signal, the following steps are conducted: predistorting the signal to be transmitted by means of cascaded predistortion amplitude and phase look-up tables interposed between the signal source and the input of the power amplifier, producing a first feedback signal in response to the predistorted signal, producing a second feedback signal in response to the amplified output signal from the power amplifier, delaying the first feedback signal for eliminating any time lag between the first and second feedback signals, and real time modeling the predistortion amplitude and phase look-up tables in response to the first and second feedback signals in order to update these two tables. The position of the delay circuit (delaying step), that permits the use of the real time modeling procedure, eliminates the convergence time and the requirement for any iterative algorithms.

18 Claims, 4 Drawing Sheets

OTHER PUBLICATIONS

"A New Baseband Linearizer for More Efficient Utilization of Earth Station Amplifiers Used for QPSK Transmissions" Girard et al., IEEE J. on Selec. Areas in Comm. vol. Sac–1, No. 1, Jan. 1983, pp. 46–56.

"Adaptation Behavior of a Feedforward Amplifier Linearizer" J.K.Cavers, IEEE Trans. on Vehicular Technology, vol. 44, No.1. Feb. 1995, pp. 31–40.

"A Wide–Band Feedforward Amplifier" Meyer et al., IEEE Journal of Solid–State Circuits vol. SC–9, No. 6, Dec. 1974, pp. 422–428.

"Direct Conversion Transceiver Design for Compact Low–Cost Portable Mobile Radio Terminals" Bateman et al., Center for Communications Research, U. of Bristol, pp. 57–62, 1989.

"Novel Linearizer Using Balanced Circulators aand Its Application to Multilevel Digital Radio Systems" Imai et al., IEEE Trans. on Micro. Theory and Tech. vol. 37, No. 8, Aug. 1989 pp. 1237–1243.

"An assessment of the Performance of Linearisation schemes in the Australian Mobilesat System by simulation" T.A.Wilkinson, 6th Int'l Conf. on Mobile Radio and Personal Comm. UK 1991, pp. 74–76.

"Linear Amplification Technique for Digital Mobile Communications" Y.Nagata, Comm. Res. Lab. C&C Systems Res. Labs. 1989, pp. 159–164.

"Amplifier Linearization Using a Digital Predisorter with Fast Adaptation and Low Memory Requirements" J.K. Cavers, IEEE Trans. on Vehic.Tech. vol. 39, No. 4, Nov. 1990, pp. 374–382.

"Adaptive Linearisation Using Pre–Distortion" Faulkner et al. CH2846–4/90/0000–0035 1990 IEEE, pp. 35–39.

"Analysis and Compensation of Bandpass Nonlinearities for Communications" Kaye et al., IEEE Trans. on Communications, Oct. 1972, pp. 965–972.

"Signal Processing WorkSystem" Communications Library Reference, Alta Group of Cadence Design Systems, Inc, Mar. 1995, pp. i–iii, pp. iv–xiv.

— AM-AM
--- AM-PM
····· RTM

FIG.3a ooo RTM 23 samples
— Pred. function

FIG.3b ooo RTM 23 samples
— Pred. function

FIG.4

ADAPTIVE DIGITAL PREDISTORTION FOR POWER AMPLIFIERS WITH REAL TIME MODELING OF MEMORYLESS COMPLEX GAINS

BACKGROUND OF THE INVENTION

1. Field of the Invention

The present invention relates to an adaptive predistortion method and device for power amplifiers dedicated in particular but not exclusively to spectrally efficient microwave mobile communication equipments.

2. Brief Description of the Prior Art

With the increasing demand on the RF and microwave spectrum, caused by the proliferation of wireless communications and satellite networks, more spectrally efficient modulation techniques will have to be developed. Linear modulation methods, like M-ary QAM, meet this requirement with high units of bits per second per Hertz. But since it has a high envelope variation, their performance is strongly dependent on the linearity of the transmission system. In addition, modern wireless radio systems like mobile cellular and emerging Personal Communication Systems (PCS) require a high power efficiency to extend the battery life of the portables. To maximize the power added efficiency and the power output, the power amplifier is often operated near saturation where the input/output power characteristics become nonlinear. Unfortunately, if linear modulation with fluctuating envelope is used in conjunction with a highly efficient nonlinear amplification, distortion and spectral spreading into adjacent channels will occur. In order to reduce these undesired effects and meet the desired power and spectral efficiency, linearization techniques have been introduced.

A variety of linearization methods have been reported and many different ways can be used to segment this topic. Factors such as average transmitter power, operating bandwidth, power efficiency, adaptability and complexity are significant considerations in design compromises that can be used to categorize the different techniques. In general, all these techniques are, by any measure, derived from three main types named:

i) Feed-forward (R. Meyer, R. Eschenbach and W. Edgerley, Jr. "A wide-Band Feedforward Amplifier", IEEE J. of Solid-State Circuits, vol. sc-9, no. 6, pp. 442–428, December 1974), which includes an open loop configuration, can handle a multicarrier signal but can not easily be controlled against the effects of drift. Moreover, their low power efficiency make it suitable in base station only. A good analysis of adaptation behavior has been presented in J. Cavers, "Adaptation Behavior of a Feedforward Amplifier Linearizer", IEEE Transactions on Vehicular Technology, vol. 44, no. 1, pp. 31–40, February 1995;

ii) Feedback (A. Bateman & D. Haines, "Direct Conversion Transceiver Design for Compact Low-Cost Portable Mobile Radio Terminals" IEEE Conf. pp. 57–58, 1989), which presents an excellent reduction of out-of-band emissions, is relatively easy to implement. However, stability requirement limits its bandwidth because of its critical dependence on the loop delay; and iii) Predistortion (N. Imai, T. Nojima and T. Murase, "Novel Linearizer Using Balanced Circulators and Its Application to Multilevel Digital Radio Systems", IEEE Transactions on Microwave Theory and Techniques, vol. 37, no. 8, pp. 1237–1243, August 1989), this technique has historically been the most common method in analog implementation. This method uses a nonlinear element which precedes the device to be compensated, its gain-expansion characteristic cancels the gain compression of the amplifier. Like feed-forward, it has an open loop configuration and therefore is very sensitive to drifts.

In recent years, the technology progress of Digital Signal Processors (DSP) has been one of the motive of the imminent course toward digital modulation techniques. Actually, the digital signal can be processed in such a way that greater bandwidth efficiency and voice quality can be obtained. In addition various applications such as generation of accurate gain and phase matching in two quadrature modulating signals, real-time compensation for channel impairments and the benefits of fast computational machines have motivated the use of these processors in several methods of linearization. These techniques are called Digital Linearization Techniques.

One of the features of the digital techniques is the control against the effects of drift. It is well known, that the power amplifier characteristic are quite sensitive to temperature variation and some unbalance in the linearization process can be occurred. In order to overcome this problem and avoid the effect of device power supply precision and drifts produced by switching between channels, adaptability is needed. In this way, an adaptive digital predistorter is the most promising technique that can be applied to narrow band Personal Communication Service using a DSP. The first successful work was presented by Y. Nagata, "Linear Amplification Technique for Digital Mobile Communications", in Proc. IEEE Veh. Technol. Conf. Sans Francisco, Calif., pp. 159–164, 1989 using a two-dimensional Look-Up Table (LUT) technique with adaptive digital feedback at baseband and pulse shaping filter prior to predistortion. This technique has shown the advantage that any order of nonlinearity and any modulation format can be supported. Followed later by J. Cavers, "Amplifier Linearization Using a Digital Predistorter with Fast Adaptation and Low Memory Requirement", IEEE Transactions on Vehicular Technology, vol. 39, no. 4, pp. 374–382, November 1990 and M. Faulkner, T. Mattsson and W. Yates, "Adaptive Linearization Using Predistortion", in Proc. 40th IEEE Veh. Technol. Conf. pp. 35–40, 1990, several drawbacks were eliminated using a one-dimensional table. This has made possible that less memory is needed and therefore, the convergence time has been reduced. These previous techniques were based on iterative algorithms.

An interesting idea was proposed by T. Wilkinson, "An Assessment of the Performance of Linearization Schemes in the Australian Mobilsat System by Simulation", IEE 6th Int. Conf. on Mobile Radio, London, pp. 74–76, 1991 using two look-up tables, one for the amplitude and the second for the phase. Each LUT includes one hundred entries covering the range of input levels and linear interpolation is used to determine values between entries. This later technique does not consider any adaptability dedicated to drift correction.

OBJECTS OF THE INVENTION

An object of the present invention is therefore to eliminate the above described drawbacks of the prior art, in particular to eliminate the convergence time and the need for iterative algorithms.

SUMMARY OF THE INVENTION

More specifically, in accordance with the present invention, there is provided an adaptive method for predistorting a signal to be transmitted, supplied by a signal source to an input of a power amplifier having an output for delivering an amplified output signal. This method comprises the steps of predistorting the signal to be transmitted by means of predistortion amplitude and phase look-up table means interposed between the signal source and the input of the power amplifier, producing a first feedback signal in response to the predistorted signal, producing a second feedback signal in response to the amplified output signal from the power amplifier, delaying at least one of the first and second feedback signals for eliminating any time lag between these first and second feedback signals, and updating the predistortion amplitude and phase look-up table means in response to the first and second feedback signals.

Preferably, the delaying step comprises delaying the first feedback signal in order to eliminate any time lag between the first and second feedback signals, the updating step comprises real time modeling the predistortion amplitude and phase look-up table means in response to the first and second feedback signals, the real time modeling comprises using a linear or third-order cubic spline interpolation, and the predistorting step comprises predistorting the signal to be transmitted by means of cascaded one-dimensional predistortion amplitude and phase look-up tables.

Also in accordance with the present invention, there is provided an adaptive device for predistorting a signal to be transmitted, supplied by a signal source to an input of a power amplifier having an output for delivering an amplified output signal. The device comprises predistorter means comprising predistortion amplitude and phase look-up table means interposed between the signal source and the input of the power amplifier for amplitude and phase predistorting the signal to be transmitted, means for producing a first feedback signal in response to the predistorted signal from the predistorter means, means for producing a second feedback signal in response to the amplified output signal from the power amplifier, delay means for eliminating any time lag between the first and second feedback signals, and means for updating the predistortion amplitude and phase look-up table means in response to the first and second feedback signals.

Advantageously, the updating means comprises means for real time modeling the predistortion amplitude and phase look-up table means in response to the first and second feedback signals, the predistortion amplitude and phase look-up table means comprises, in cascade, a one-dimensional predistortion amplitude look-up table and a one-dimensional predistortion phase look-up table, and the delay means comprises means for delaying the first feedback signal in order to eliminate any time lag between the first and second feedback signals.

In accordance with a preferred embodiment:

the signal to be transmitted is a digital signal;

the predistortion amplitude and phase look-up table means are digital predistortion amplitude and phase look-up table means for producing a digital predistorted signal;

the adaptive signal predistorting device comprises a digital-to-analog converter for converting the digital predistorted signal into an analog predistorted signal and a quadrature modulator for converting the analog predistorted signal into a microwave signal supplied to the input of the power amplifier; and the means for producing a second feedback signal comprises a microwave coupler for supplying a portion of the amplified output signal of the power amplifier to a quadrature demodulator producing, in response to this portion of the amplified output signal of the power amplifier, a demodulated analog signal and an analog-to-digital converter for converting the demodulated analog signal into the second feedback signal, in digital form.

According to another preferred embodiment of the invention, the signal to be transmitted comprises an amplitude component and a phase component, and the predistorter means comprises:

the one-dimensional predistortion amplitude look-up table for producing a predistorted amplitude in response to the amplitude component of the signal to be transmitted;

the one-dimensional predistortion phase look-up table for producing a predistorted phase in response to the predistorted amplitude; and means for combining the phase component of the signal to be transmitted, the predistorted amplitude and the predistorted phase into the predistorted signal at the output of the predistorter means.

Thanks to the position of the delay circuit, the convergence time and the requirement for any iterative algorithms are eliminated through real time modeling and by using a linear or third-order cubic spline interpolation.

The objects, advantages and other features of the present invention will become more apparent upon reading of the following non restrictive description of a preferred embodiment thereof, given by way of example only with reference to the accompanying drawings.

DETAILED DESCRIPTION OF THE PREFERRED EMBODIMENT

Figure 1:
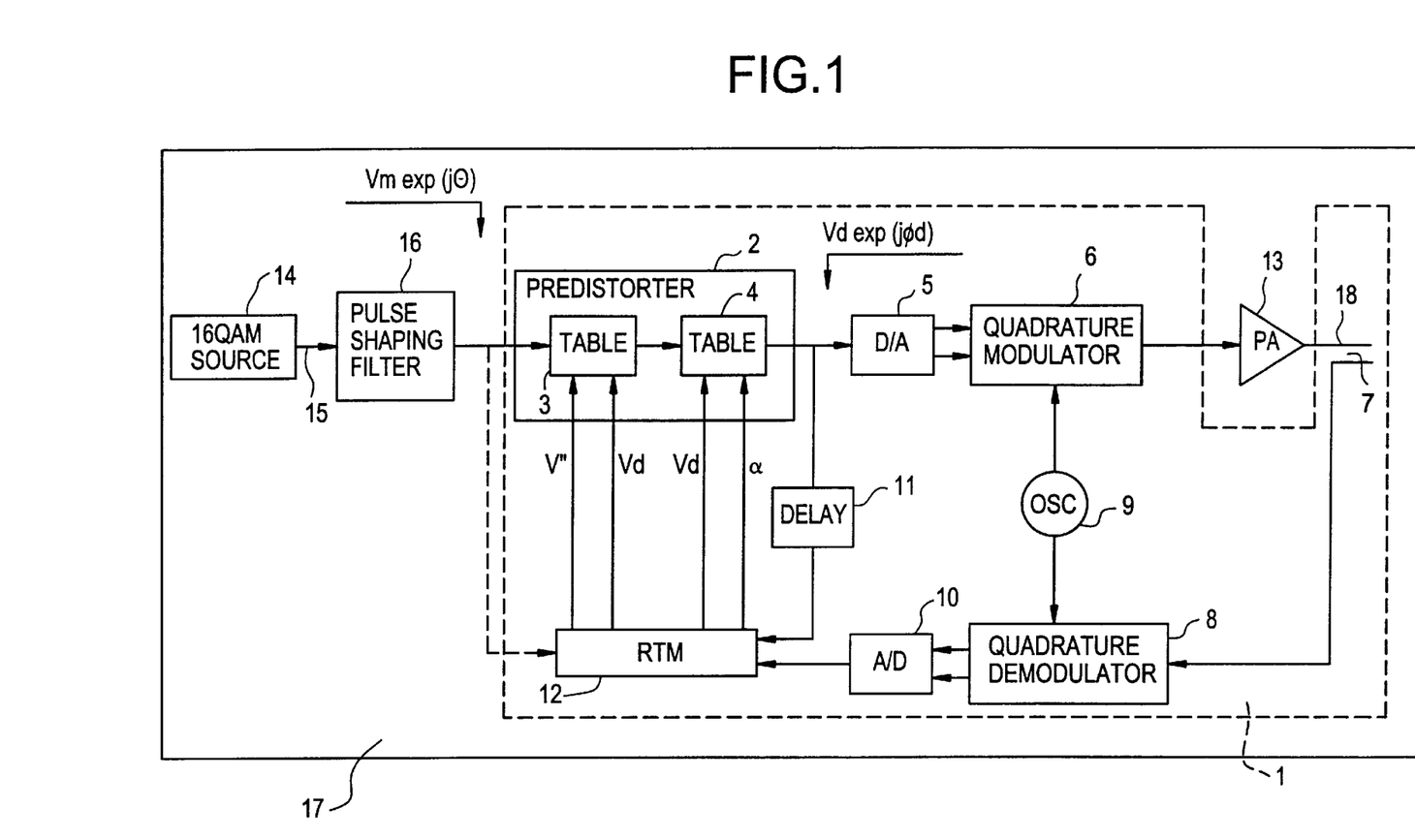
FIG. 1 is a block diagram of an adaptive digital predistorting device in accordance with the present invention, comprising a predistorter.

Referring to FIG. 1 of the appended drawings, a preferred embodiment of the adaptive digital predistorting device according to the invention is presented. This adaptive digital predistorting device is generally identified by the reference 1.

As shown in FIG. 1, the amplifier system 17 includes an adaptive digital predistorting device 1 comprising: a predistorter 2 including a one-dimensional predistortion amplitude look-up table 3 and a one-dimensional predistortion phase look-up table 4; a digital-to-analog (D/A) converter 5; a quadrature modulator 6; a microwave coupler 7; a quadrature demodulator 8; an oscillator 9; an analog-to-digital (A/D) converter 10; a delay circuit 11; and a Real Time Modeling (RTM) circuit 12.

The amplifier system 17 further comprises a microwave power amplifier 13 to amplify the microwave signal from the quadrature modulator 6.

In the illustrated example, the spectrally efficient 16-QAM modulation method is used by a source 14 to produce a 16-QAM modulated signal 15 to be transmitted. Of course, it is within the scope of the present invention to use another type of source. Signal 15 is passed through a pulse shaping circuit 16 ensure Free-Symbol-Interference (FSI).

A microwave power amplifier used in mobile communication, such as power amplifier 13 of FIG. 1, must operate close to saturation to achieve both high power efficiency and high transmitted power. The microwave power amplifier 13 is said to be saturated when its output power level no longer increases in response to an increase of its input power level. Close to the saturation region, the input/output characteristic of the microwave power amplifier 13 becomes nonlinear and, therefore, amplitude and phase distortion are generated when digital modulation with fluctuating envelope is used. These effects are identified within the modulated signal as additional amplitude and phase modulations that may degrade the Bit-Error-Rate (BER) performance of the modulation scheme. In addition, a time invariant microwave power amplifier can be classified as having either zero memory or non zero memory. If the microwave amplifier 13 is wideband in comparison to the input signal, it is considered as having zero memory and its input-output characteristic can be given by the following relation:

$$y(t)=T[x(t)] \quad (1)$$

where y(t) is the output signal of the microwave power amplifier, x(t) is the input signal of the same amplifier, and T is the memoryless complex gain of that microwave power amplifier.

Figure 2A:
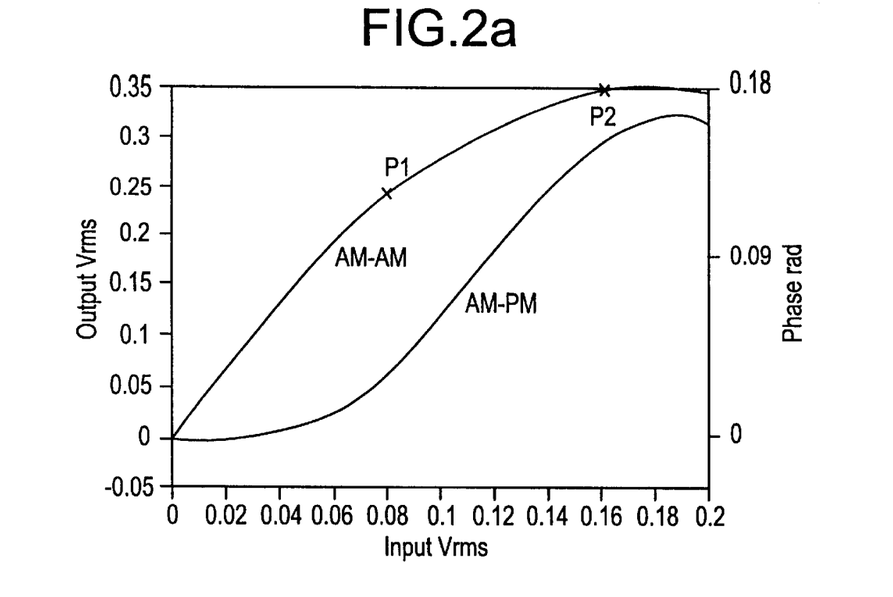
FIG. 2a is a graph showing the AM-AM and AM-PM characteristics of a microwave power amplifier of class AB.

In this way, a memoryless nonlinearity of the microwave power amplifier 13 can be considered because of the narrowband of the baseband signal relative to the bandwidth of the power amplifier 13. Then, the memoryless complex gain T is expressed as a function of the amplitude only, hence the possibility to use a one-dimensional look-up table during the predistortion procedure; this means that the nonlinearity of the power amplifier 13 is independent of the frequency and phase of the microwave signal. Therefore, the memoryless complex gain T is modeled through the amplitude transfer characteristic AM-AM of the power amplifier 13 and the AM-PM conversion factor of the same amplifier as shown in FIG. 2a. Let the input signal of the microwave power amplifier 13 be:

$$S(t)=V_m(t) \cos[\omega_c t+\theta(t)] \quad (2)$$

where $V_m(t)$ is a time-dependent amplitude, $\omega_c$ is the angular frequency of the input signal, t is a time variable, and $\theta(t)$ is a time-dependent phase shift of the input signal.

The output signal may then be expressed as follows:

$$Z(t)=G[V_m(t)] \cos\{\omega_c t+\theta(t)+\phi[V_m(t)]\} \quad (3)$$

where:
  $G[V_m(t)]$ is the AM-AM amplitude transfer characteristic of the power amplifier 13; and
  $\phi[V_m(t)]$ is the AM-PM conversion factor of the power amplifier 13.

Then, the memoryless complex gain of the power amplifier 13 is given by the following relation:

$$T_m(t)=G[V_m(t)]e^{j\phi[V_m(t)]} \quad (4)$$

Now, considering the complex gain of the predistorter 2 in a sub-system whose output is the input signal of the microwave power amplifier 13, the resulting predistorted signal can be written as follows:

$$S_p(t)=V_d(t) \cos\{\omega_c t+\theta(t)+\alpha[V_d(t)]\} \quad (5)$$

where $V_d(t)$ and $\alpha[V_d(t)]$ are the predistorted amplitude and phase respectively.

Then, the output signal of the power amplifier 13 will be:

$$Z_p(t)=G[V_d(t)] \cos\{\omega_c t+\theta(t)+\alpha[V_d(t)]+\phi[V_d(t)]\} \quad (6)$$

From equations (2) and (6), one can see that the conditions that must be satisfied to properly correct the AM and PM distortions are:

$$G[V_d(t)]=KV_m(t) \quad (7)$$

$$\phi[V_d(t)]+\alpha[V_d(t)]=0 \quad (8)$$

where K is the expected constant gain of the power amplifier 13 and $V_m(t)$ is the amplitude modulation of the input signal to be amplified, i.e. supplied to the power amplifier 13.

A) Equivalent Low Pass Signal

The complex envelope method as described by Signal Processing WorkSystem (SPW), Alta Group of Cadence Design System, Inc., 1996, using the concepts of equivalent lowpass signals and systems, has been used to analyse and simulate the amplifier system 17. More specifically, the representation of bandpass signals and systems can be given in terms of equivalent lowpass waveforms under the condition that their bandwidths are much smaller than the carrier frequency (J. G. Proakis, "Digital Communications", McGraw Hill, 1983). In this case, the equivalent lowpass signal must be derived from their modulated passband counterparts. The modulated carrier signal x(t) can be written as:

$$x(t)=Re[V(t)e^{j[2\pi f_c t+\phi(t)]}]=Re[V(t)e^{j\phi(t)}e^{j2\pi f_c t}] \quad (9)$$

where V(t) is the amplitude modulation, $\phi(t)$ is the phase modulation, $f_c$ is the carrier frequency, and $Re[\cdot]$ denotes the real part of the quantity in brackets. The complex envelope of the bandpass signal or the equivalent lowpass complex signal $S_b(t)$ is given by:

$$s_b(t)=V(t)e^{j\phi(t)} \quad (10)$$

This is an equivalent polar representation where V(t) is the amplitude modulation and $\phi(t)$ is the phase modulation of the baseband signal. The advantage to model the microwave signal and the linearized power amplifier 13 at baseband is that it simplifies the analysis and reduces dramatically the number of iterations during simulation when the amplifier system 17 is analysed.

In this manner, equation (10) can be treated as an equivalent lowpass signal. Then, in order to map the information into a corresponding set of discrete amplitudes and phases, the signal waveforms may be represented as:

$$x_{bm}(t)=V_m e^{j\phi_m}u(t) m=1,2,3,\ldots,M \quad (11)$$

where $\{V_m,\phi_m,m=1,2,3,\ldots,M\}$ represent the M possible symbols in the signal-space diagram and u(t) is the waveform impulse response of the pulse shaping filter 16. The term u(t) is selected to control the spectral characteristics of the transmitted signal. In general, the equivalent lowpass complex signal that must be transmitted over the power amplifier 13 can be written in time domain as:

$$S(t) = \sum_{n=1}^{\infty} V_n e^{j\phi_n} u(t-nT) \qquad (12)$$

where $\{V_n, \phi_n\}$ represents the sequence of transmitted information symbols that change at the signalling intervals nT, n=1,2,3, . . . , and T is the symbol period.

B) Real Time Modeling (RTM)

In order to capture and eliminate the higher intermodulation levels generated by the power amplifier 13, equation (12) must be oversampled according to the bandwidth to be compensated. To simplify the analysis, we can model a discrete signal through the impulse sampling representation considering the sample-data as a number occurring at a specific instant of time. In this case, the discrete signal may be represented as a sequence of impulse functions of the form:

$$S(n) = \sum_{i=1}^{\infty} V_i e^{j\phi_i} \gamma(n - iT') \qquad (13)$$

where y(n−iT') represents the impulse sampling at the signalling intervals iT' (i=1,2,3, . . . ,), T' is the sampling period and $\{V_i, \phi_i\}$ are the discrete amplitudes and phases of the signal trajectory in the signal-space diagram.

In this manner, using the equation (13), the equivalent lowpass of the amplifier input signal $V_d e^{j\Phi_d}$ and the feedback signal $(1/K)V'e^{j\Phi'}$ (FIG. 1), are oversampled to provide a number of data samples. These pairs of complex samples correspond to an ascending list of values of the amplitude of the input signal. These values must be spread out to cover the overall range of the input envelope levels and must satisfy:

$$0 \leq V_{d0} < V_{d1} < V_{d2} < \ldots < V_{dq} \qquad (14)$$

Then, the sequences of complex samples can be written as:

$$\sum_{l=1}^{q} V_{dl} e^{j\phi_{dl}} \gamma(n - lT') \qquad (15)$$

$$\sum_{l=1}^{q} V_l'' e^{j\phi_l'} \gamma(n - lT') \qquad (16)$$

where q is the number of samples and V''=(1/K)V'.

From (15) and (16), the samples of phase distortion can be obtained as:

$$\sum_{l=1}^{q} \phi_l = \sum_{l=1}^{q} \phi_l' - \phi_{dl} \qquad (17)$$

Then, the set of data points $(V_{d1}, V_1''), (V_{d2}, V_2''), \ldots, (V_{dq}, V_q'')$ and $(V_{d1}, \phi_1), (V_{d2}, \phi_2), \ldots (V_{dq}, \phi_q)$ are used to perform interpolations. These interpolations permit to determine both the relative envelope transfer functions $g[V_d(t)]$ and the envelope dependent phase shift $\phi[V_d(t)]$ which are expressed as:

$$V''(t) = g[V_d(t)] \qquad (18)$$

$$\phi = \phi[V_d(t)] \qquad (19)$$

Then, the memoryless complex gain of the power amplifier 13 can be expressed as an equivalent complex envelope transfer function as follows:

$$T_d(t) = G[V_d(t)] e^{j\phi[V_d(t)]} \qquad (20)$$

where $G[V_d(t)]$ is obtained from the normalized $g[V_d(t)]$.

Figure 2B:
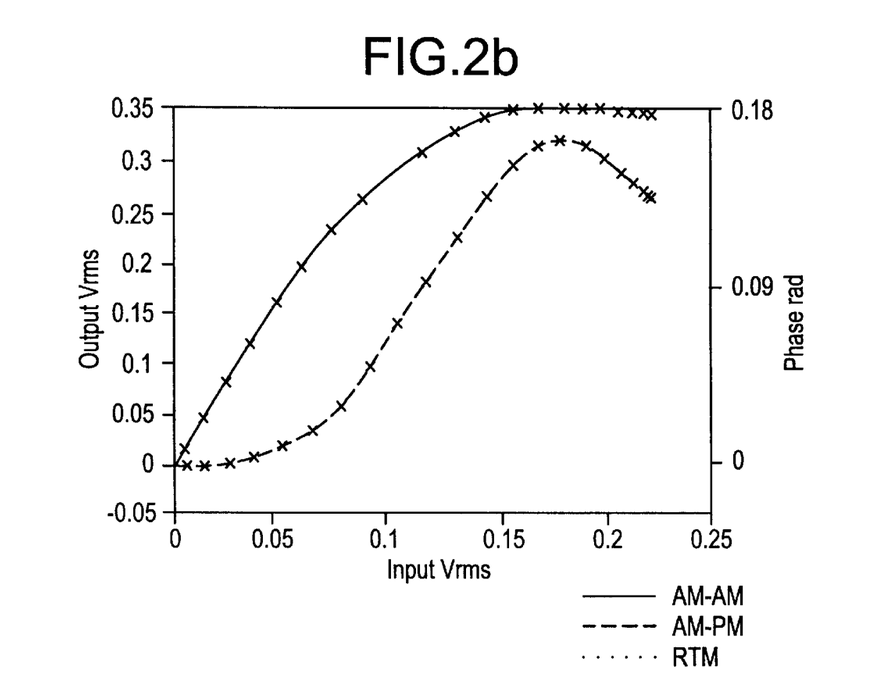
FIG. 2b is a graph comparing the AM-AM and AM-PM characteristics of a microwave power amplifier of class AB obtained by measurements and Real Time Modeling (RTM)

FIG. 2b shows a comparison between the measured AM-AM and AM-PM characteristics and the Real Time Modeling (RTM) results of a class AB power amplifier 13. To this end, 23 complex samples of Real Time Modeling were used to interpolate the Memoryless Complex Gains (MCG) function. Of course, the present invention is usable with other classes of amplifiers.

C) Predistortion

Based on the above equations (7) and (8) that must be satisfied to ideally correct the AM and PM distortion, the optimal compensation made by predistortion can be achieved when the compensation envelope transfer function is given by:

$$V_d(t) = g^{-1}[V''(t)] \qquad (21)$$

and the compensation phase characteristic is given by:

$$\alpha[V_d(t)] = -\phi[V_d(t)] \qquad (22)$$

Under these conditions, the set of data points of amplitudes $(V_{d1}, V_1'')$ from (15) and (16) are interchanged as $(V_1'', V_{d1})$ and the set of data points of phase distortion are put in opposition according to (22). Then, the updating of the one-dimensional amplitude and phase look-up tables 3 and 4 is made in a form in which there is correspondence between input and output values of the look-up tables as illustrated by the following relation (23). It is important to note that the input amplitude $V_m(t)$ and the predistorted input amplitude $V_d(t)$ are used to point to an address of the look-up tables 3 and 4, respectively. These look-up tables 3 and 4 implement a mapping from the input to the output, according to the number of sampled pairs, using linear or cubic spline interpolation. If cubic spline interpolation is used, only a small number of sampled pairs are needed.

$$V_m(t) \rightarrow \begin{bmatrix} V_1 \\ V_2 \\ \vdots \\ V_q \end{bmatrix} \rightarrow \begin{bmatrix} V_{d1} \\ V_{d2} \\ \vdots \\ V_{dq} \end{bmatrix} \rightarrow V_d(t) \qquad (23)$$

$$V_d(t) \rightarrow \begin{bmatrix} V_{d1} \\ V_{d2} \\ \vdots \\ V_{dq} \end{bmatrix} \rightarrow \begin{bmatrix} \alpha_1 \\ \alpha_2 \\ \vdots \\ \alpha_q \end{bmatrix} \rightarrow \alpha$$

Figure 4:
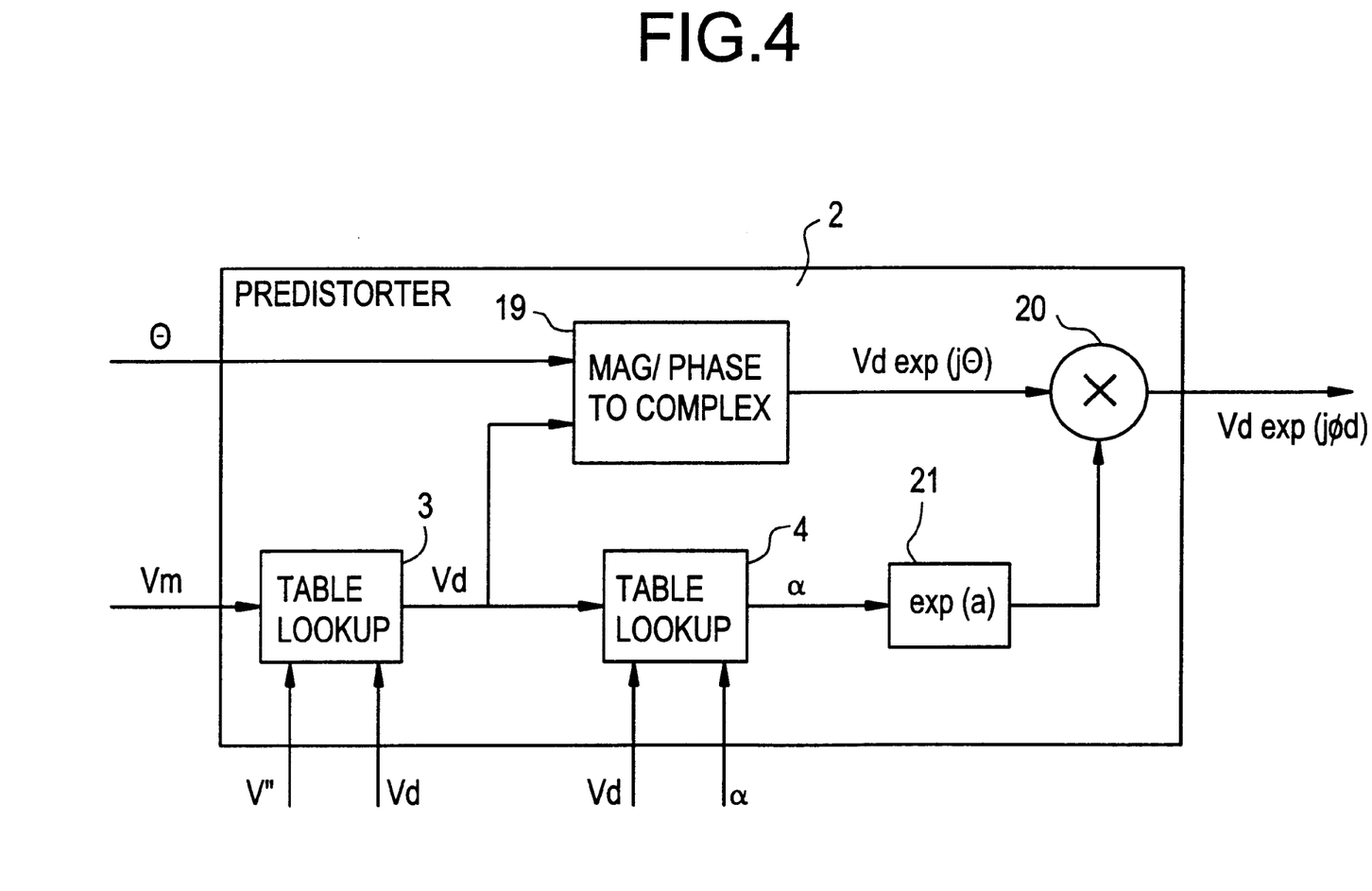
FIG. 4 is a block diagram of the predistorter of the adaptive digital predistorting device of FIG. 1.

Referring to FIGS. 1 and 4, the 16-QAM modulated signal from the pulse shaping filter 16 is supplied to the predistorter 2. FIG. 4 is a schematic block diagram showing a possible configuration of the predistorter 2 to obtain the predistorted power amplifier input signal. In the case of FIG. 2, a polar representation was chosen to configure the one-dimensional predistortion amplitude and phase look-up tables 3 and 4 and these can be accessed in cascade form where the first and the second tables generate the predistorted amplitude and phase respectively.

As shown in FIG. 4, the 16-QAM modulated signal from the pulse shaping circuit 16 has a phase component θ and an amplitude component $V_m(t)$. The phase component θ is supplied to a magnitude/phase-to-complex converter 19.

The amplitude component $V_m(t)$ is supplied to the one-dimensional predistortion amplitude look-up table 3 which then outputs the predistorted amplitude $V_d(t)$.

The predistorted amplitude $V_d(t)$ is supplied to the converter 19 along with the phase component $\theta$ to produce the signal $V_d(t)e^{j\theta}$. The predistorted amplitude $V_d(t)$ is also supplied as input signal of the one-dimensional predistortion phase look-up table 4 to produce the predistorted phase $\alpha$. The predistorted phase $\alpha$ is supplied to one input of a multiplier 20 through a phase-to-complex converter 21. The other input of the multiplier 20 is supplied with the signal $V_d(t)e^{j\theta}$ to produce the predistorted input signal $V_d(t)e^{j\Phi_d}$ (FIG. 1).

The predistorted input signal $V_d(t)e^{j\Phi_d}$ is digital-to-analog converted by the D/A converter 5 and the digital-to-analog converted signal $V_d(t)e^{j\Phi_d}$ is processed through the quadrature modulator 6, supplied by the oscillator 9, to produce a microwave signal supplied to the input of the microwave power amplifier 13. An amplified microwave signal is supplied on the output 18 of the microwave power amplifier 13.

To enable the RTM circuit 12 of FIG. 1 to update the one-dimensional predistortion amplitude and phase look-up tables 3 and 4:
  the signal at the output of the pulse shaping filter 16 is supplied to the RTM circuit 12;
  a small portion of the predistorted input signal $V_d(t)e^{j\Phi_d}$ at the output of the predistorter 2 is supplied to the RTM circuit 12 through a delay circuit as a first feedback signal; and
  a small portion of the microwave amplified signal at the output 18 of the microwave power amplifier 13 is supplied by the microwave coupler 7 to the quadrature demodulator 8, also supplied with the oscillator 9. The A/D converter 17 analog-to-digital converts the output of the quadrature demodulator 8 to produce a version of the predistorted input signal $V_d(t)e^{j\Phi_d}$ corresponding to the output of the microwave power amplifier 13 supplied to the RTM circuit 12 as a second feedback signal.

To eliminate any time lag between the first and second feedback signals, the delay circuit 11 is provided to retard the predistorted input signal $V_d(t)e^{j\Phi_d}$. In order to estimate the delay to be compensated for by circuit 11, the following relation (24) is used:

$$z(m) = \frac{1}{N}\sum_{n=0}^{N-1} x(k)y^*(k+m) \tag{24}$$

In relation (24) x(k), the input signal sequence of the power amplifier (corresponding to the predistorted input signal $V_d(t)e^{j\Phi_d}$), and y(k), the feedback signal sequence (corresponding to the output of the power amplifier), are correlated to determine the delay to be compensated for by circuit 11. In fact, y(k) is the delayed and distorted version of the input x(k). In practice, it is possible to access only a finite segment of these sequences. If N is the longer of these segments, m the delay variable and L the delay between signals, the correlation sequence z(m) can be written as in relation (24). Then the sequence z(m) is expected to reach a maximum for m=L. Because of the memoryless condition of all components in the feedback loop (D/A converter 6, quadrature modulator 6, power amplifier 13, coupler 7, quadrature demodulator 8 and A/D converter 10), this provides an accurate measurement of the delay time.

Due to the position of the delay circuit 11, the requirement for any iterative algorithms is eliminated through Real Time Modeling (RTM circuit 12) and by using a linear or third-order cubic spline interpolation.

Real Time Modeling is then conducted as described hereinabove by circuit 12 to update the above described values V", $V_d$, and $\alpha$ of the one-dimensional predistortion amplitude and phase look-up tables 3 and 4.

Figure 3A:
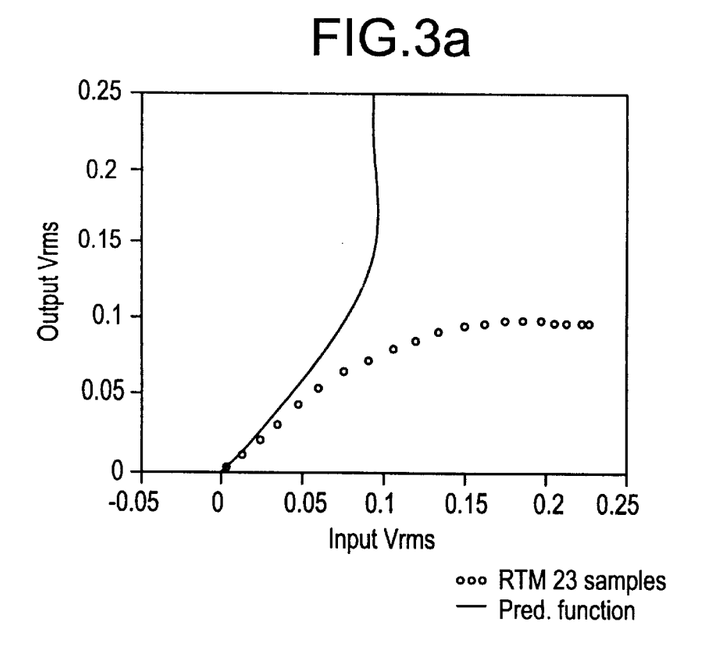
FIG. 3a is a graph showing an interpolated amplitude predistortion function and 23 amplitude samples obtained by Real Time Modeling.
Figure 3B:
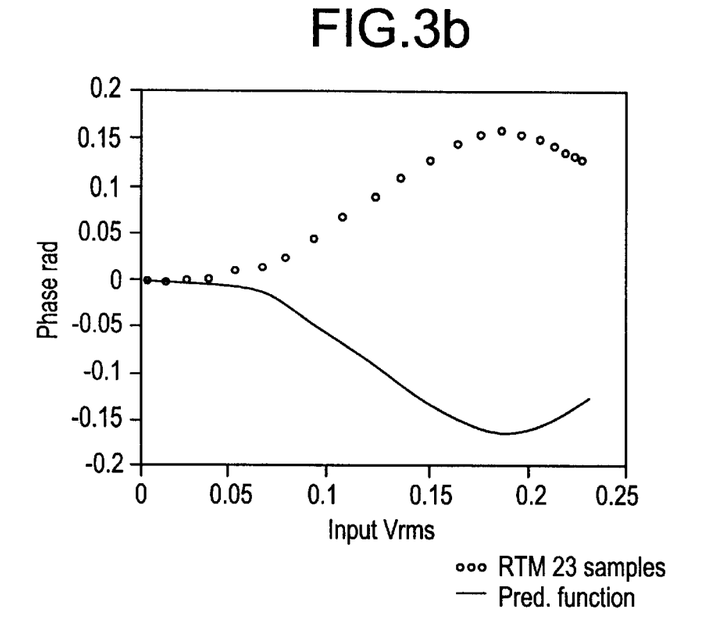
FIG. 3b is a graph showing an interpolated phase predistortion function and 23 phase samples obtained by Real Time Modeling.

FIGS. 3a and 3b show both the 23 samples from Real Time Modeling which represent the AM-AM and AM-PM characteristics of the power amplifier 13 and the predistortion functions that have been interpolated according to the above relation (21). Note that the AM-AM characteristic of the power amplifier 13 has been normalized relative to the small-signal gain.

D) Interpolation and Curve Fitting

When a set of data point such as $(x^1, y_1), \ldots, (x_n, y_n)$ are known and the abscissas $\{x_k\}$ are distinct, several methods can be used to determine a function y=f(x) that relates these variables (J. H. Mathews, "Numerical Methods", for Computer Science, Engineering, and Mathematics, McGraw Hill, 1989]. One possibility is to construct a polynomial with coefficients that can be calculated such that the curve passes through the data points. For a successful result, the set of points must be known with a high degree of accuracy which limits the use of this approach. Curve fitting methods, like least-squares polynomial optimization techniques, offer a good accuracy when the set of data points are produced through an experimental set up. However, this case is frequently unsatisfactory, because a polynomial of degree N can have N−1 local extrema and it may exhibit large oscillations when data points do not lie on a polynomial curve. A solution for this problem is to use interpolation by spline functions. In the present method, the curve denoted by S(x) is formed by a set of lower-degree polynomials $\{S_k(x)\}$ and interpolation is performed between the successive data points. Linear, quadratic and cubic spline interpolation may be used and can be extended to higher-degree polynomial with more additional computation.

In the case of linear spline and according to purpose which is the interpolation of the predistorsion function, a large number of data-points is needed to obtain a good compensation of the distortion. In quadratic spline, the curvature at the even node $(X_{2k}, Y_{2k})$ changes abruptly and this can cause an undesired distortion. Cubic splines show a good performance and is the most tempting when a smooth curve is required. In addition, only a small number of data-points is needed for a good compensation of distortion. It is known that the drawback of spline interpolation is that control at the edge point is difficult.

To conclude, the RTM algorithm has demonstrated to be a powerful tool for sounding and modeling the memoryless complex gains of a microwave power amplifier during normal data transmission. In particular, the RTM algorithm eliminates the need for complex convergence algorithms in the adaptation update step. Also, any order of nonlinearity and any modulation format can be supported by this technique.

Although the present invention has been described hereinabove by way of a preferred embodiment thereof, this embodiment can be modified at will, within the scope of the appended claims, without departing from the spirit and nature of the subject invention.

What is claimed is:

1. An adaptive method for predistorting a signal to be transmitted, supplied by a signal source to an input of a power amplifier having an output for delivering an amplified output signal, comprising the steps of:
    predistorting the signal to be transmitted by means of predistortion amplitude and phase look-up table means interposed between the signal source and the input of the power amplifier;

producing a first feedback signal in response to the predistorted signal;

producing a second feedback signal in response to the amplified output signal from the power amplifier;

delaying at least one of the first and second feedback signals for eliminating any time lag between said first and second feedback signals;

modeling the power amplifier in response to the first and second feedback signals; and updating the predistortion amplitude and phase look-up table means in response to said modeling of the power amplifier.

2. An adaptive signal predistorting method as recited in claim 1, wherein the power amplifier has a memoryless complex gain, and wherein said modeling step comprises real time modeling the memoryless complex gain of the power amplifier in response to the first and second feedback signals.

3. An adaptive signal predistorting method as recited in claim 2, wherein said real time modeling of the memoryless complex gain of the power amplifier comprises using spline interpolation selected from the group consisting of linear spline interpolation, quadratic spline interpolation and cubic spline interpolation.

4. An adaptive signal predistorting method as recited in claim 3, in which said cubic spline interpolation is selected from the group consisting of linear cubic spline interpolation and third-order cubic spline interpolation.

5. An adaptive signal predistorting method as recited in claim 1, wherein the predistorting stop comprises predistorting the signal to be transmitted by means of cascaded one-dimensional predistortion amplitude and phase look-up tables.

6. An adaptive signal predistorting method as recited in claim 1, wherein said delaying step comprises delaying the first feedback signal in order to eliminate any time lag between the first and second feedback signals.

7. An adaptive signal predistorting method as recited in claim 1, wherein the predistortion amplitude and phase look-up table means comprises an input for receiving said signal supplied by the signal source and an output for delivering the predistorted signal, and wherein said predistorting step comprises implementing through said predistortion amplitude and phase look-up table means a mapping from the source signal receiving input to the predistorted signal delivering output using spline interpolation selected from the group consisting of linear spline interpolation, quadratic spline interpolation and cubic spline interpolation.

8. An adaptive signal predistorting method as recited in claim 5, wherein the cascaded one-dimensional predistortion amplitude and phase look-up tables comprise an input for receiving said signal supplied by the signal source and an output for delivering the predistorted signal, and wherein said predistorting step comprises implementing through said cascaded one-dimensional predistortion amplitude and phase look-up tables a mapping from the source signal receiving input to the predistorted signal delivering output using spline interpolation selected from the group consisting of linear spline interpolation, quadratic spline interpolation and cubic spline interpolation.

9. An adaptive device for predistorting a signal to be transmitted, supplied by a signal source to an input of a power amplifier having an output for delivering an amplified output signal, comprising:

predistorter means comprising predistortion amplitude and phase look-up table means interposed between the signal source and the input of the power amplifier for amplitude and phase predistorting the signal to be transmitted;

means for producing a first feedback signal in response to the predistorted signal from the predistorter means;

means for producing a second feedback signal in response to the amplified output signal from the power amplifier;

delay means for eliminating any time lag between the first and second feedback signals;

means for modeling the power amplifier in response to the first and second feedback signals; and means for updating the predistortion amplitude and phase look-up table means in response to said modeling of the power amplifier.

10. An adaptive signal predistorting device as recited in claim 9, wherein the power amplifier has a memoryless complex gain, and wherein said modeling means comprises means for real time modeling the memoryless complex gain of the power amplifier in response to the first and second feedback signals.

11. An adaptive signal predistorting device as recited in claim 9, wherein the predistortion amplitude and phase look-up table means comprises one-dimensional predistortion amplitude and phase look-up table means.

12. An adaptive signal predistorting device as recited in claim 9, in which the predistortion amplitude and phase look-up table means comprises, in cascade, a one-dimensional predistortion amplitude look-up table and a one-dimensional predistortion phase look-up table.

13. An adaptive signal predistorting device as recited in claim 9, wherein said delay means comprises means for delaying the first feedback signal in order to eliminate any time lag between the first and second feedback signals.

14. An adaptive signal predistorting device as recited in claim 9, wherein:

the signal to be transmitted is a digital signal;

the predistortion amplitude and phase look-up table means are digital predistortion amplitude and phase look-up table means for producing a digital predistorted signal;

said adaptive signal predistorting device comprises a digital-to-analog converter for converting the digital predistorted signal into an analog predistorted signal and a quadrature modulator for converting the analog predistorted signal into a microwave signal supplied to the input of the power amplifier;

said means for producing a second feedback signal comprises a microwave coupler for supplying a portion of the amplified output signal of the power amplifier to a quadrature demodulator producing, in response to said portion of the amplified output signal of the power amplifier, a demodulated analog signal and an analog-to-digital converter for converting the demodulated analog signal into said second feedback signal, in digital form.

15. An adaptive signal predistorting device as recited in claim 14, wherein the power amplifier has a memoryless complex gain, and wherein said modeling means comprises means for real time modeling the the memoryless complex gain of the power amplifier in response to the first and second feedback signals.

16. An adaptive signal predistorting device as recited in claim 9, wherein the predistorter means comprises an input for receiving said signal supplied by the signal source and an output for delivering the predistorted signal, and wherein said predistortion amplitude and phase look-up table means comprises a look-up table arrangement for implementing a mapping from the source signal receiving input to the predistorted signal delivering output using spline interpolation selected from the group consisting of linear spline interpolation, quadratic spline interpolation and cubic spline interpolation.

17. An adaptive signal predistorting method as recited in claim 12, wherein the predistorter means comprises an input for receiving said signal supplied by the signal source and an output for delivering the predistorted signal, and wherein the cascaded one-dimensional predistortion amplitude and phase look-up tables comprises means for implementing a mapping from the source signal receiving input to the predistorted signal delivering output using spline interpolation selected from the group consisting of linear spline interpolation, quadratic spline interpolation and cubic spline interpolation.

18. An adaptive device for predistorting a signal to be transmitted, supplied by a signal source to an input of a power amplifier having an output for delivering an amplified output signal, comprising:

predistorter means comprising predistortion amplitude and phase look-up table means interposed between the signal source and the input of the power amplifier for amplitude and phase predistorting the signal to be transmitted;

means for producing a first feedback signal in response to the predistorted signal from the predistorter means;

means for producing a second feedback signal in response to the amplified output signal from the power amplifier;

delay means for eliminating any time lag between the first and second feedback signals; and means for updating the predistortion amplitude and phase look-up table means in response to the first and second feedback signals;

wherein the predistortion amplitude and phase look-up table means comprises, in cascade, a one-dimensional predistortion amplitude look-up table and a one-dimensional predistortion phase look-up table;

wherein said signal to be transmitted comprises an amplitude component and a phase component; and wherein said predistorter means comprises:

said one-dimensional predistortion amplitude look-up table for producing a predistorted amplitude in response to the amplitude component of the signal to be transmitted;

said one-dimensional predistortion phase look-up table for producing a predistorted phase in response to the predistorted amplitude; and means for combining the phase component of the signal to be transmitted, the predistorted amplitude and the predistorted phase into said predistorted signal.

* * * * *